United States Patent [19]

Hama et al.

[11] Patent Number: 5,792,261

[45] Date of Patent: *Aug. 11, 1998

[54] PLASMA PROCESS APPARATUS

[75] Inventors: Kiichi Hama, Chino; Jiro Hata; Toshiaki Hongoh, both of Yamanashi-ken, all of Japan

[73] Assignee: Tokyo Electron Limited, Tokyo, Japan

[*] Notice: The term of this patent shall not extend beyond the expiration date of Pat. No. 5,525,159.

[21] Appl. No.: 624,102

[22] Filed: Mar. 29, 1996

Related U.S. Application Data

[63] Continuation of Ser. No. 357,423, Dec. 16, 1994, Pat. No. 5,525,159.

[30] Foreign Application Priority Data

| Dec. 17, 1993 | [JP] | Japan | 5-343871 |
| Mar. 23, 1994 | [JP] | Japan | 6-076717 |
| Mar. 23, 1994 | [JP] | Japan | 6-076727 |

[51] Int. Cl.[6] .................................. C23C 16/00
[52] U.S. Cl. .................... 118/723 I; 118/723 R; 156/345
[58] Field of Search ............ 118/723 R, 723 MP, 118/723 MW, 723 MA, 723 E, 723 I, 723 IR, 719, 723 AN, 723 ER; 156/345; 204/298.01, 298.02, 298.31, 298.25, 298.26, 298.35

[56] References Cited

U.S. PATENT DOCUMENTS

| 4,563,367 | 1/1986 | Sherman | 427/39 |
| 5,167,717 | 12/1992 | Boitnott | 118/724 |
| 5,280,154 | 1/1994 | Cuomo et al. | 219/121.52 |
| 5,326,404 | 7/1994 | Sato | 118/723 MR |
| 5,413,684 | 5/1995 | Bergmann | 204/192.13 |
| 5,494,522 | 2/1996 | Moriya et al. | 118/719 |
| 5,542,559 | 8/1996 | Kawakami et al. | 216/67 |
| 5,580,385 | 12/1996 | Paranjpe et al. | 118/723 I |

*Primary Examiner*—R. Bruce Breneman
*Assistant Examiner*—Luz Alejandro
*Attorney, Agent, or Firm*—Oblon, Spivak, McClelland, Maier & Neustadt, P.C.

[57] ABSTRACT

A plasma CVD apparatus for forming a silicon film on an LCD substrate includes a container which is divided into process and upper chambers by a quartz partition plate. A work table on which the substrate is mounted is arranged in the process chamber and a lower electrode to which a high frequency potential is applied is arranged in the work table. First lower and second upper supply heads are arranged between the partition plate and the work table in the process chamber. $SiH_4$ and $H_2$ gas and He gases are supplied through the first and second supply heads. He gas is transformed into plasma while $SiH_4$ and $H_2$ gas is excited and decomposed by the plasma thus formed. Two coils are arranged in the upper chamber and high frequency voltages are applied to the coils to generate electromagnetic field to induce the transforming of He gas into plasma. High frequency voltages applied to the coils are the same in phase and directions of current flowing through adjacent portions of the coils are the same.

16 Claims, 10 Drawing Sheets

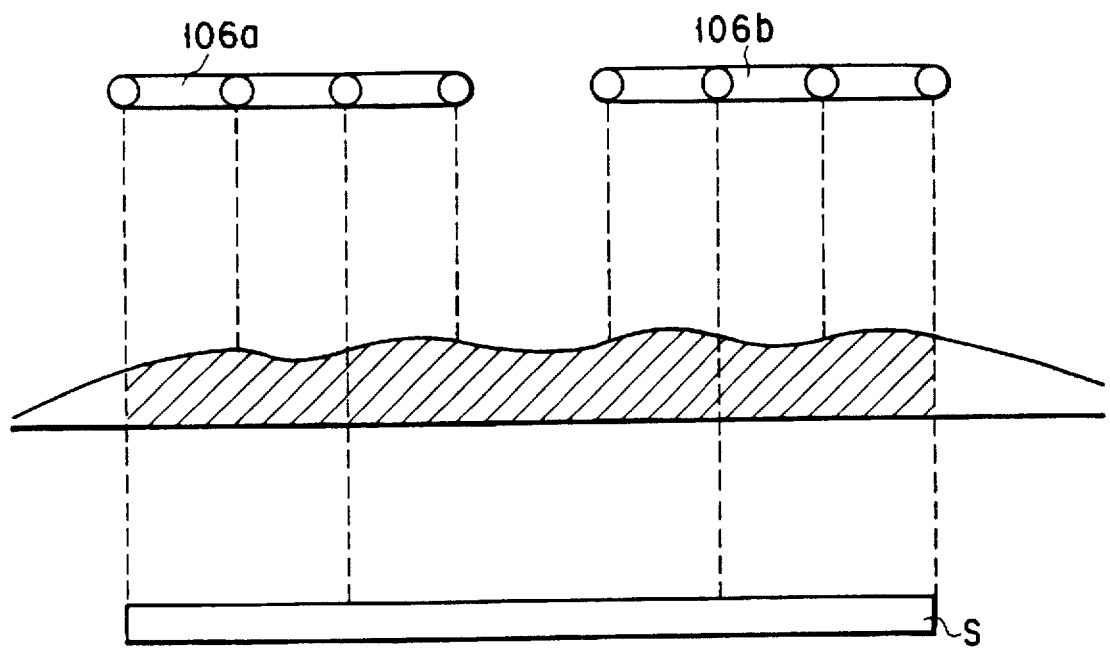
F I G. 10

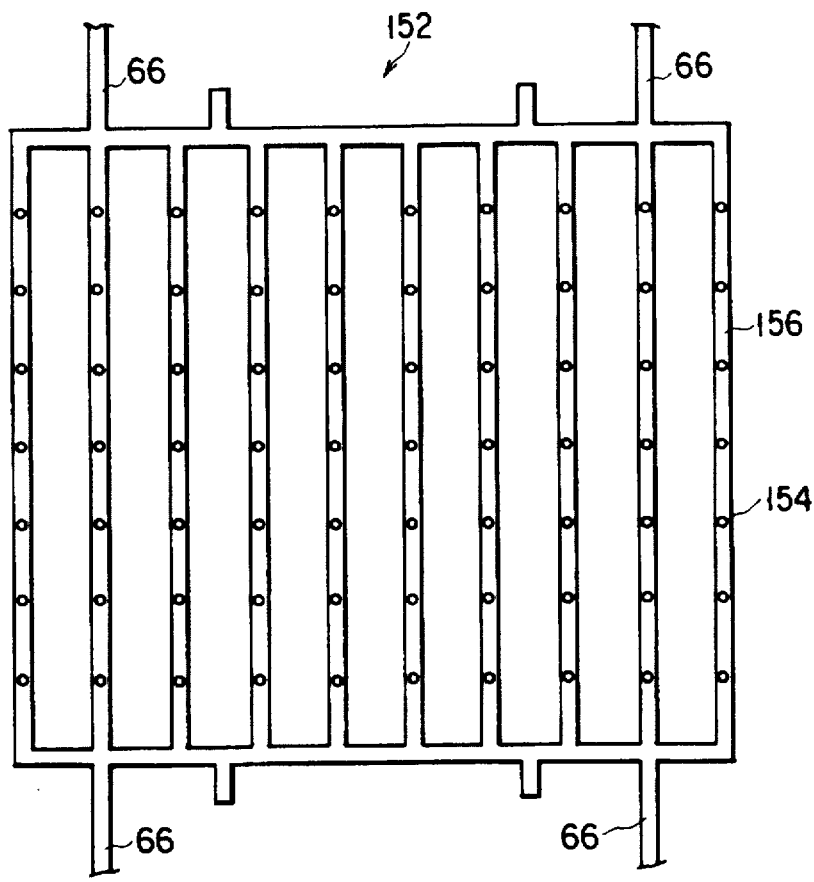
F I G. 12
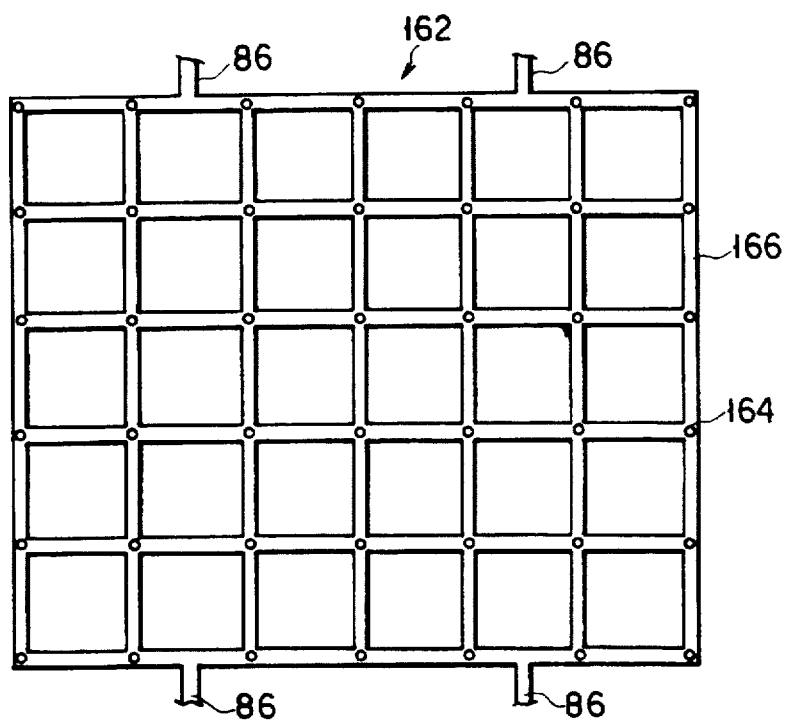
F I G. 13

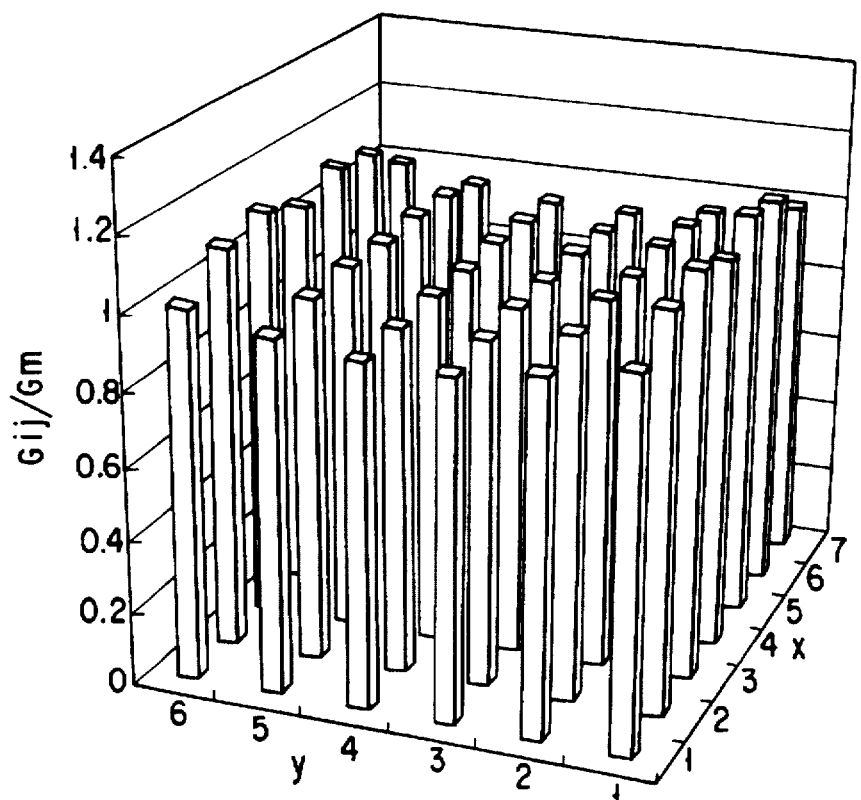
F I G. 16
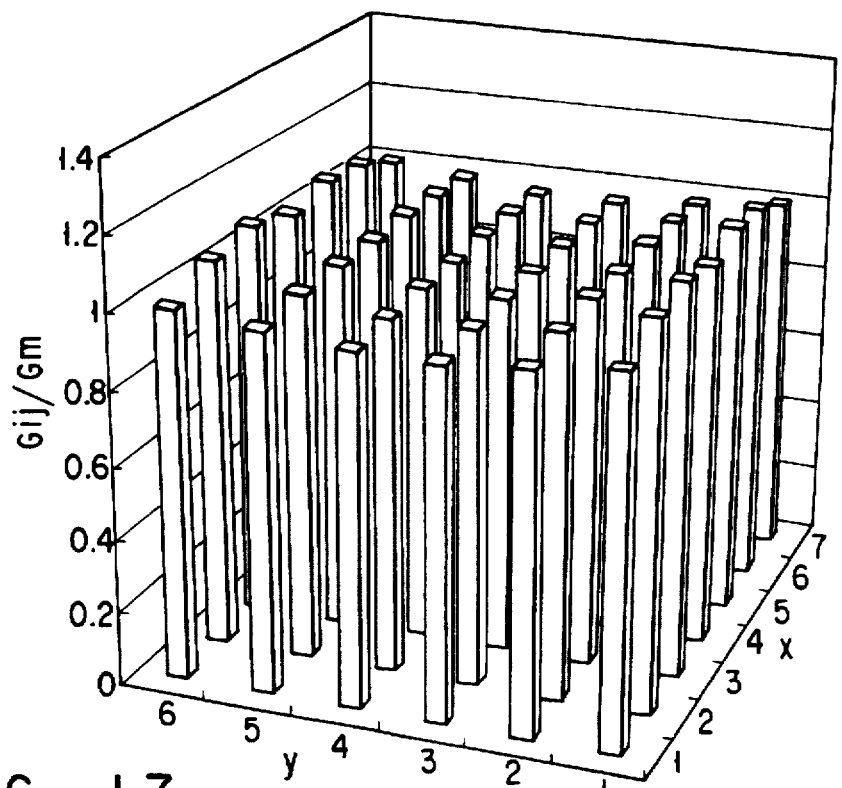
F I G. 17

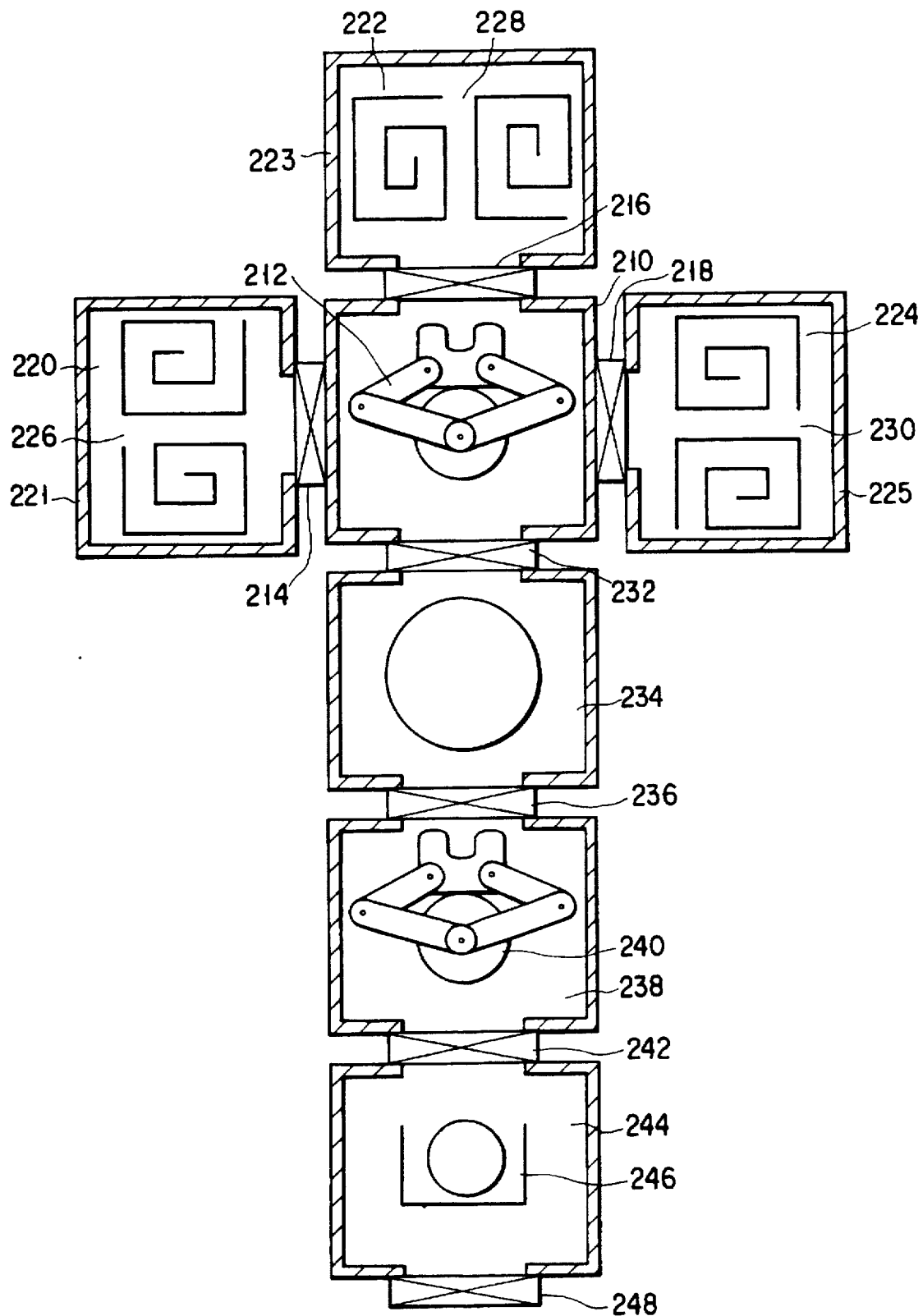
F I G. 22

1

PLASMA PROCESS APPARATUS

This is a continuation of application Ser. No. 08/357,423, filed on Dec. 16, 1994, now U.S. Pat. No. 5,525,159.

BACKGROUND OF THE INVENTION

1. Field of the Invention

The present invention relates to a plasma process apparatus and, more particularly, a plasma CVD apparatus for using plasma to process substrates such as semiconductor wafers and LCD substrates.

2. Description of the Related Art

In a plasma process apparatus disclosed in Jpn. Pat. Appln. KOKAI Publication No. Hei 3-79025, a flat induction coil is arranged outside a process chamber by an insulating shield, and a radio frequency power supply is connected to the induction coil. The induction coil produces induction electromagnetic field to induce the movement of electrons and develop plasma.

In another plasma process apparatus disclosed in European Patent Publication No. 0,379,828, radio frequency is added to a vortex or spiral induction coil to generate plasma in the process chamber. Plasma is closed in the process chamber by bipolar magnetic field.

FIG. 11 shows the profile of film thickness of a semiconductor film formed on a semiconductor wafer by a conventional plasma CVD apparatus in which an RF induction coil is used. The RF induction coil 2 has an outer diameter substantially the same as that of the wafer W and is arranged coaxial to the wafer W. Hatched portion between the coil 2 and the wafer W in FIG. 11 represents the profile of film thickness of the film formed.

When the conventional apparatus is used, the film thickness becomes small at the center and the outer rim portion of the wafer W while it becomes large between the center and the outer rim portion thereof, as shown in FIG. 11. This unevenness of film thickness cannot be ignored as the diameter of the wafer W becomes larger and larger, to 6, 8 and 12 inches. In a substrate like the LCD (liquid crystal display) substrate having a large area of 500 mm×600 mm or 550 mm×650 mm, the unevenness of film thickness of a formed film provides a problem.

The RF induction coil is arranged adjacent to a quartz-made dielectric window which is a part of wall for defining the process chamber. In the case of the plasma process, particularly the film forming process, by-products easily adhere to the inner face of the window. When the by-products are conductive, the induction electromagnetic field generated by the RF induction coil is disturbed and plasma thus formed becomes sometimes uneven.

SUMMARY OF THE INVENTION

The object of the present invention is therefore to increase or enhance the uniformity of process applied to a face of the substrate by the plasma process apparatus in which the RF induction coil is used.

According to a first aspect of the present invention, there is provided an apparatus for processing a process region of a substrate, using a plasma, comprising: a casing for defining an air-tight process chamber and provided with a window plate made of dielectric; an exhaust for exhausting and setting the process chamber to a vacuum; a work table arranged in the process chamber and having a support face opposed to the window plate, the substrate being mounted on the support face of the work table, facing the process region to the window plate; a main supply for supplying a process gas between the window plate and the substrate on the support face of the work table, at least a part of the process gas being transformed into the plasma; an induction electrode for generating electromagnetic field between the window plate and the substrate on the support face of the work table to induce generation of the plasma, and including plural conductive coils arranged outside the process chamber and opposed to the window plate; and a power supply section for applying high frequency voltages to the coils; wherein high frequency voltages applied to the coils are the same in phase and directions of current flowing through adjacent portions of the coils are the same.

According to a second aspect of the present invention, there is provided an apparatus for processing a process region of a substrate, using a plasma, comprising: a casing for defining an air-tight process chamber and provided with a window plate made of dielectric; an exhaust for exhausting and setting process chamber to a vacuum; a work table arranged in the process chamber and having a support face opposed to the window plate, the substrate being mounted on the support face of the work table, facing the process region to the window plate; a main supply for supplying a process gas between the window plate and the substrate on the support face of the work table, at least a part of the process gas being transformed into the plasma; an induction electrode for generating electromagnetic field between the window plate and the substrate on the support face of the work table to induce generation of the plasma, and including plural conductive coils arranged outside the process chamber and opposed to the window plate; and a power supply section for applying high frequency voltages to the coils at different phases to enable electromagnetic field components formed by the coils to less interfere with each other.

According to a third aspect of the present invention, there is provided a CVD apparatus for forming a film on a process region of a substrate, using a plasma, comprising: a casing for defining an air-tight process chamber and provided with a window plate made of dielectric; an exhaust for exhausting and setting the process chamber to a vacuum; a work table arranged in the process chamber and having a support face opposed to the window plate, the substrate being mounted on the support face of the work table, facing the process region to the window plate; a main supply for supplying a process gas between the window plate and the substrate on the support face of the work table, and including a first supply member having a first supply head made of dielectric and arranged between the window plate and the support face of the work table and a second supply member arranged between the window plate and the first supply member, the first supply head including a plurality of supply holes to uniformly cover the whole of the process region of the substrate on the support face, the process gas including first and second gases supplied through the first and second supply members, respectively, and the second gas being transformed into the plasma while the first gas being excited and decomposed by the plasma thus formed to provide a material of the film; an induction electrode for generating electromagnetic field between the window plate and the substrate on the support face of the work table to induce generation of the plasma, and including plural conductive coils arranged outside the process chamber and opposed to the window plate; and a power supply section for applying high frequency voltages to the coils.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 shows the profile of film thickness of a film formed by the apparatus in FIG. 1;

FIG. 12 is a bottom view showing a variation of the first supply head;

FIGS. 13 and 14 are bottom views showing variations of the second supply head, respectively;

FIGS. 15 through 17 show distributions of quantity of gas fed through supply holes of the first supply head;

FIG. 22 is a sectional view showing a process system of the cluster tool type in which a plasma CVD apparatus according to the present invention is used.

DETAILED DESCRIPTION OF THE PREFERRED EMBODIMENTS

Figure 1:
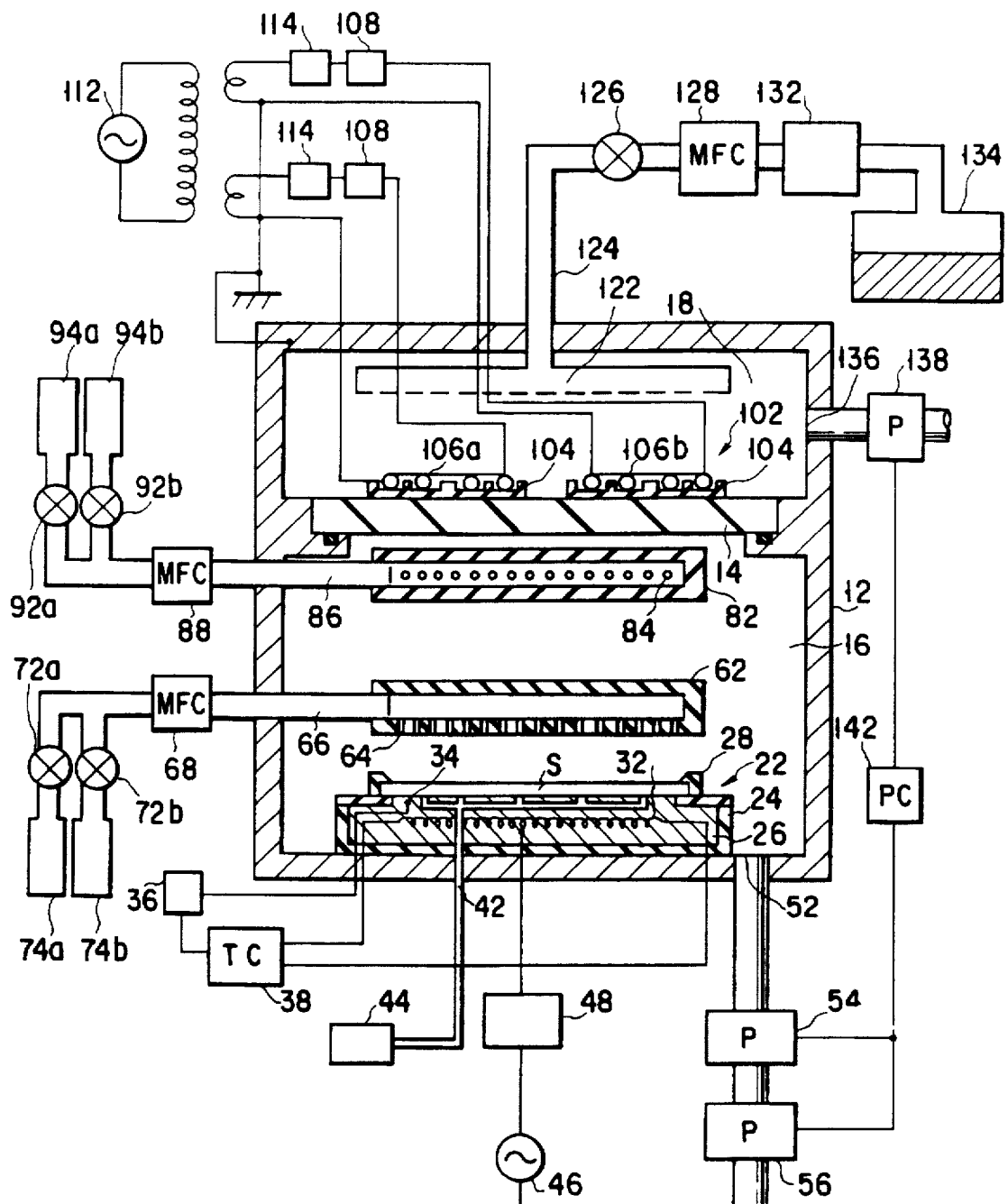
FIG. 1 is a sectional view showing a plasma CVD apparatus according to a first embodiment of the present invention.

The plasma CVD apparatus according to a first embodiment of the present invention shown in FIG. 1 is used to form polysilicon or amorphous silicon film used for thin film transistors (TFTs) on a glass substrate in the liquid color display (LCD) manufacturing course.

The CVD apparatus has an air-tight container 12 made of aluminium. Inner walls of the container 12 are alumite-processed by anodic oxidation not to cause any contamination matter from the walls. The container 12 is divided into process and upper air-tight chambers 16 and 18 by a window or partition plate 14 made of dielectric such as quartz. The partition plate 14 has an area larger than that of the substrate which is to be processed. When an LCD glass substrate having an area of 550 mm×650 mm, for example, is to be processed, the partition plate 14 has an area of 750 mm×750 mm and a thickness of 30 mm–50 mm. The process chamber 16 has a volume of 40–80 liters when the LCD substrate of 550 mm×650 mm is to be processed.

A work table 22 is arranged on the bottom of the process chamber 16. It includes a frame 24 mounted on the bottom of the process chamber 16 and made of insulator, and a lower electrode 26 arranged in the frame 24. The electrode 26 is fully insulated from the container 12 by the frame 24. The top of the electrode 26 is the same in level as that of the frame 24 to thereby form a substrate support surface parallel to the partition plate 14. The work table 22 has a clamp 28 moved up and down by a drive member (not shown). The substrate S to be processed is mounted on the work table 22, seating on tops of the electrode 26 and the frame 24, and fixed on it by the clamp 28.

A temperature adjuster member 32 is arranged in the electrode 26 to set the temperature of the substrate S. It heats the substrate S to 350°–450° C., for example, during the silicon film forming process. A ceramic heater made by coating a plate-like ceramic with a CVD electric resistor can be used as the temperature adjuster member 32. In another case where the substrate S is to be cooled, there may be provided a cooling pipe through which coolant flows. It is also possible to use a combination of the heater and the cooling pipe.

A line 42 is formed in the electrode 26 to supply heat transmitting gas such as helium into a clearance between the top of the work table 22 and the underside of the substrate S. It is connected to a gas source 44, which has pressure adjusting function, outside the container 12. Heat transmitting gas assists heat transmission between the temperature adjuster member 32 and the substrate S during the plasma CVD process conducted in a vacuum atmosphere.

Temperature setting for the substrate S adds some influence to the film forming speed and film quality (better as voids are less and electric transmission rate is higher). This asks temperature control to have high accuracy. A temperature measuring member 34 such as the thermocouple, therefore, is arranged in the electrode 26, locating adjacent to the underside of the substrate S. A value measured by it is transmitted, as voltage output, to a temperature monitor 36, which compares it with a predetermined reference value and transmits a difference thus obtained to a temperature controller 38. Responsive to signal thus applied, the controller 38 controls the temperature adjuster member 32 to set the substrate S at a predetermined temperature.

Each of the temperature adjuster and measuring members 32 and 34 can be divided into plural elements arranged adjacent to the underside of the substrate S. The substrate can be thus heated to same temperature all over it even if it has such a large size of 550 mm×650 mm that causes temperature difference between its center and outer rim portions.

A high frequency power supply 46 is connected to the electrode 26 via a matching circuit 48. High frequency potential ranging from several hundreds KHz to several tens KHz is applied from the power supply 46 to the electrode 26. Ions are drawn from process gas plasma, which is formed in opposite to a surface of the substrate to be processed, onto the substrate surface by high frequency thus applied, and the film forming rate can be made higher accordingly.

The process chamber 16 is provided with an exhaust opening 52, to which turbo molecular and dry pumps 54 and 56 are connected in series. The process chamber 16 can be exhausted to a high vacuum of $10^{-6}$–$10^{-8}$ for example, by these two pumps 54 and 56 before process gas is introduced into it.

First and second heads 62 and 82 of the shower type are arranged above the work table 22 in the process chamber 16 for supplying gases. Each of them has a plurality of gas supply holes 64 or 84 which are arranged in a plane parallel to the top of the substrate S on the work table 22. They are made of dielectric such as quartz. They can also be made of semiconductor such as monocrystal, polycrystal or amorphous silicon. These dielectric and semiconductor are preferable because they less disturb electromagnetic field formed in the process chamber 16 as described later, and because they do not distort the distribution of plasma thus formed.

The first lower head 62 is led outside the process chamber 16 by a connection tube 66 which is made of quartz, for example, and formed integral to the head 62. The connection tube 66 is connected to gas sources 74a and 74b, which have valves 72a and 72b, via a mass flow controller 68 for adjusting a flow rate. These gas sources 74a and 74b store gases to be decomposed and provide materials of the CVD film.

Figure 2:
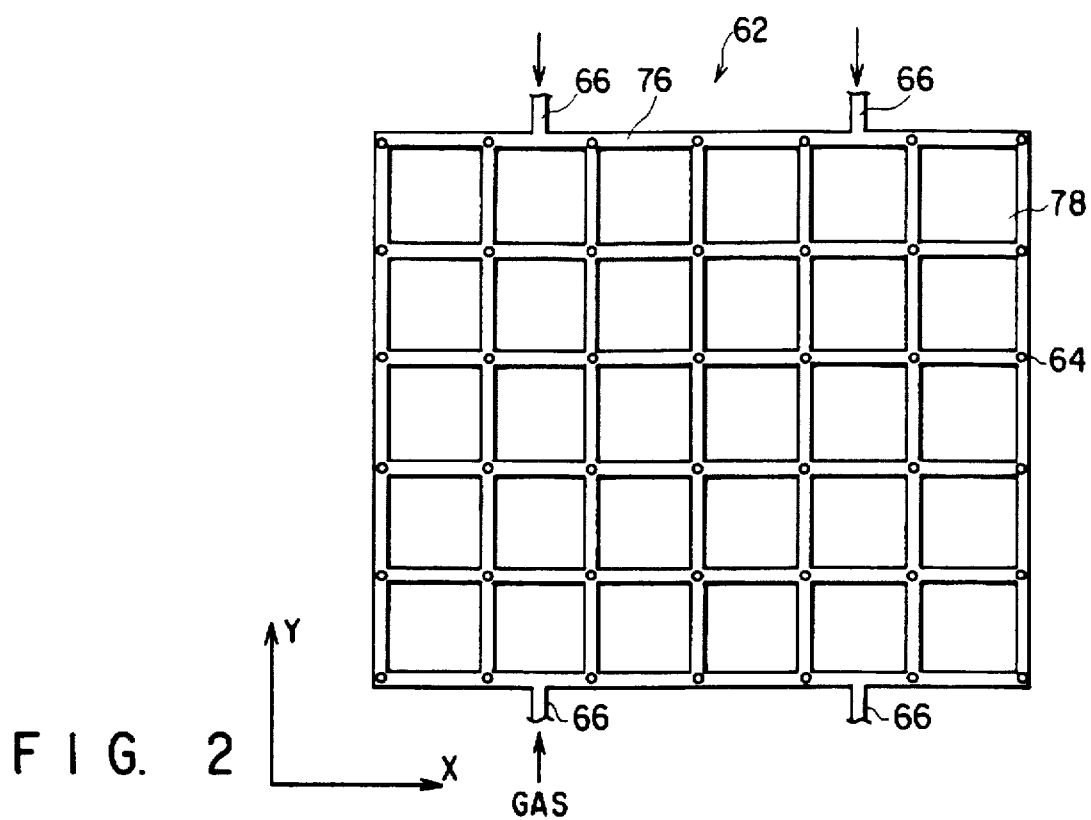
FIG. 2 is a bottom view showing a first supply head in the plasma CVD apparatus.

The first head 62 is a pipe lattice 76 as apparent from the bottom view in FIG. 2. The pipe lattice 76 has an area 10–50% larger than that region of the substrate S which is to be processed, and thus it covers all over the processed region of the substrate S. The connection tube 66 is connected to it at plural or four points, two of which are opposed to the other remaining two. These connections of the connection tube 66 to the pipe lattice 76 are simplified for clarity in FIG. 1.

Each space 78 formed by vertical and horizontal pipes of the pipe lattice 76, which serves as the first head 62, is the same square. A supply hole 64, orienting just down, is formed in the underside of the pipe lattice 76 at each crossed point thereof. The supply holes 64 are arranged in a plane parallel to the support face of the work table 22 and the substrate S on it and distributed uniformly all over the process region of the substrate S. In addition, gas is introduced into the pipe lattice 76 at two paired and opposed points thereof through the tube 66. The supply of gas through the supply holes 64 can be made substantially uniform or equal.

Each of the pipes by which the pipe lattice 76 is formed has an outer diameter of ¼ inches with a wall thickness of 1 mm under the standard and each of the supply holes 64 has a diameter of 0.1 mm–0.5 mm in this case. These dimensions are selected depending upon such conditions as kinds and amounts of gases supplied. It is desirable that each supply hole 64 has a size large enough to prevent plasma from being generated in the direction of reactive gas sources.

The second upper head 82 is led outside the process chamber 16 by a connection tube 86 which is made of quartz and integral to the head 82. The connection tube 86 is connected to gas sources 94a and 94b, which have valves 92a and 92b, via a mass flow controller 88 for adjusting a flow rate. One gas source 94a stores therein inactive gas such as Ar (argon), $N_2$ (nitrogen), Xe (xenon) and He (helium) which are transformed into plasma but not used substantially as material for a film to be formed, or $N_2$ (nitrogen) and $O_2$ (oxygen) which are transformed into plasma and used as material for a film to be formed. The other gas source 94b stores therein such gas as $ClF_3$ which serves to clean by-products from the inner walls of the process chamber 16 and the partition plate 14.

Figure 3:
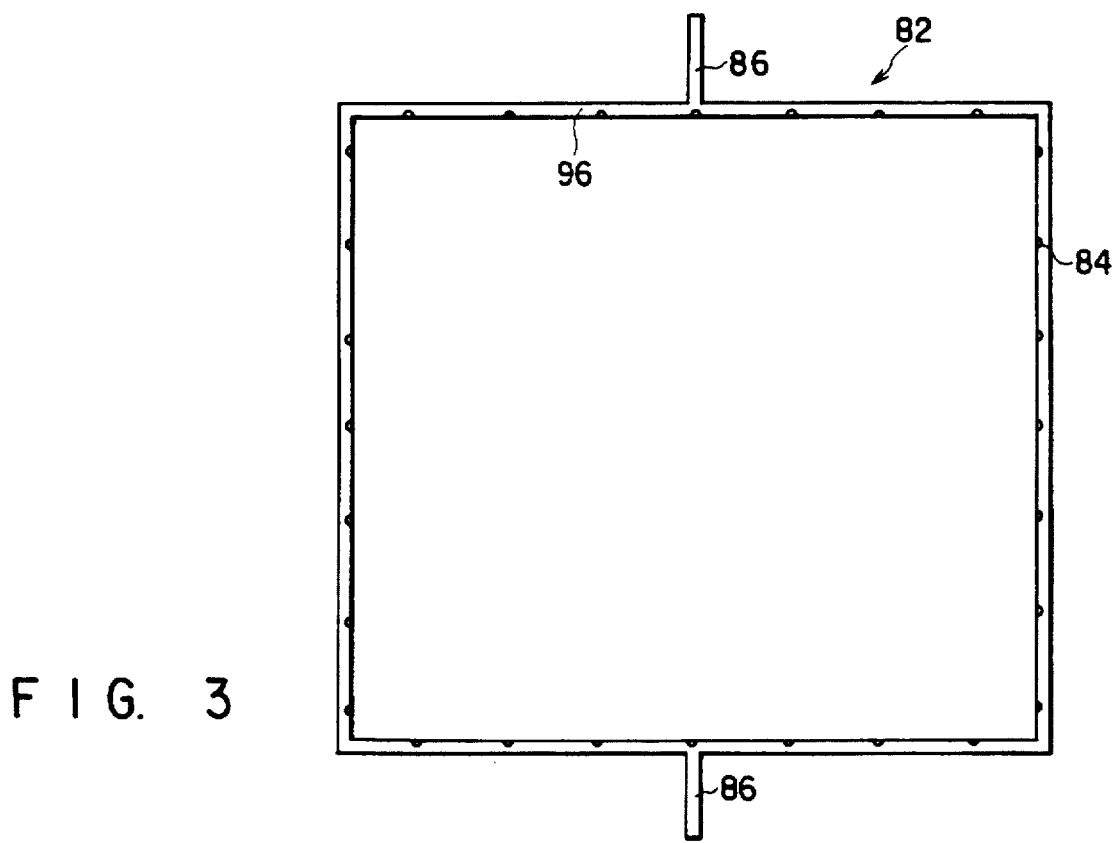
FIG. 3 is a bottom view showing a second supply head in the plasma CVD apparatus.

The second head 82 is a pipe frame 96 shaped like a square, as apparent from the bottom view in FIG. 3. The square pipe frame 96 is made the same as or a little larger than the pipe lattice 76 of the first head 62. The connection tube 86 is connected to the pipe frame 96 at plural or two points thereof which are opposed to each other. These connections of the connection tube 86 to the pipe frame 96 are simplified for clarity in FIG. 1.

Supply holes 84, each orienting just sidewards and inwards, are formed in the pipe frame 96 along the inner side thereof at the same interval. They are arranged in a plane parallel to the support face of the work table 22 and the substrate S on it and distributed uniformly along the outer rim of the process region of the substrate S. Gas is introduced into the pipe frame 96 at paired and opposed two points thereof through tube 86. The supply of gas through the supply holes 84 can be thus made substantially uniform or equal. The supply holes 84 may be formed in the underside of the pipe frame 96 and oriented just down, or in the top thereof and oriented right up.

The pipe by which the pipe frame 96 is formed has an outer diameter of ¼ inches with a wall thickness of 1 mm under the standard and each supply hole has a diameter of 0.1 mm–0.5 mm in this case. These dimensions are selected depending upon such conditions as kinds and amounts of gases supplied.

Figure 4:
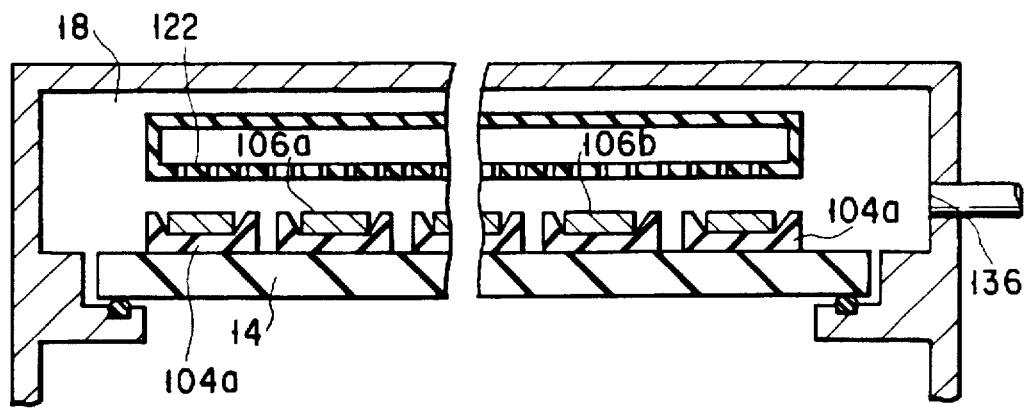
FIG. 4 is a sectional view showing an upper chamber in the apparatus in detail.
Figures 5, 19:
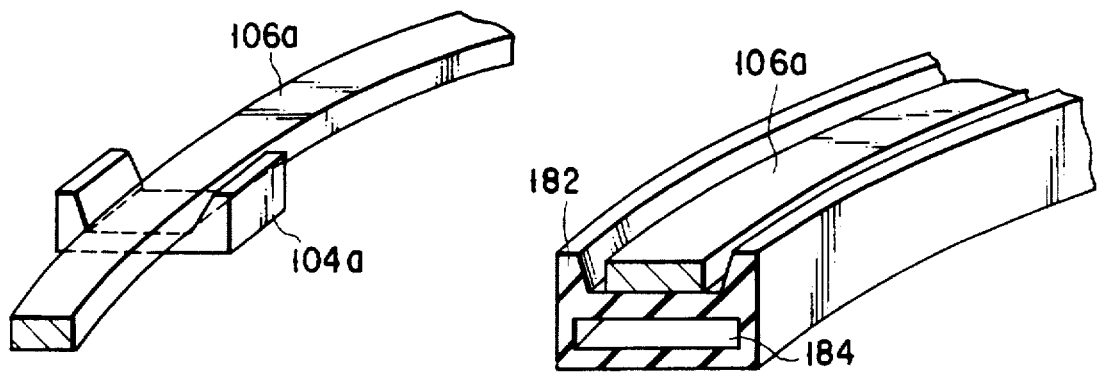
FIG. 5 is a perspective view showing how an induction electrode coil is seated on a seat.
FIG. 19 is a perspective view showing how the induction electrode coil is seated on a seat in the upper chamber of FIG. 18.

An induction electrode or antenna 102 is arranged in the upper chamber 18 which is air-tightly partitioned from the process chamber 16 by the partition plate 14. The electrode 102 comprises, in this case, plural or two coils 106a and 106b each made of electric conductor such as Al or Cu. The coils 106a and 106b are seated on plural seats 104 on the partition plate 14. Each seat 104 is made of ceramics which is adiabatic and less disturbs electromagnetic field. The seats 104 are shown simply in FIG. 1, but more specifically, each of them comprises a plurality of pieces 104a for supporting the coil 106a or 106b, as shown in FIGS. 4 and 5. These pieces 104a are fixed on the partition plate 14 and the heat expansion of each coil 106a or 106b is limited by them.

Each of the coils 106a and 106b can be made by stamping or processing a copper plate of 1 mm–5 mm thick to form a spiral coil of 5 mm–1 mm wide, or by bending a pipe, made of copper and having outer and inner diameters of 5 mm and 2 mm, into spiral, or by bending a solid copper rod, having an outer diameter of 5 mm–10 mm, into a spiral. Copper is a good electric conductor and it is excellent in that it can be easily shaped into a spiral. Gold, silver and aluminium and alloys of copper with them can be cited as other desirable coil materials.

Figure 6:
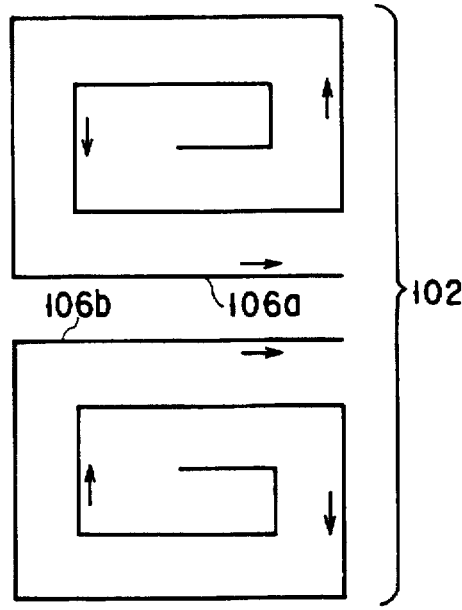
FIG. 6 is a plan view showing the induction electrode in the apparatus.

The coils 106a and 106b are connected to a high frequency power supply 112 through matching circuits 108. Radio frequency such as high frequency of 13.56 MHz, for example, is applied from the power supply 112 to the coils 106a and 106b at a same phase. As shown an FIG. 6, the coil 106a is spiraled in a direction reverse to that of the spiral of the coil 106b and directions of current flowing through them coincide with each other along adjacent portions of them to thereby prevent electromagnetic fields formed by them from interfering with each other. They occupy an area 5–50% larger than the processed region of the substrate to fully cover the whole of it.

A head 122 of the shower type opposed to the coils 106a and 106b and having a plurality of gas supply holes is arranged above the coils 106a and 106b in the upper chamber 18. The coils 106a and 106b cause Joule heat when high frequency is applied to them, and their temperatures are thus raised. They are therefore cooled by inactive coolant or gas such as nitrogen supplied from the shower head 122. The head 122 is led outside the container 12 by a tube 124 and connected to a liquid nitrogen source 134 via valve 126, a mass flow controller 128 and a temperature adjuster member 132. Liquid nitrogen in the source 134 is supplied, as gas, to the temperature adjuster member 132 and set to a predetermined temperature by it and then supplied to the head 122.

The upper chamber 18 is provided with an exhaust opening 136 to which an exhaust pump 138 is connected. The upper chamber 18 is made vacuum by the pump 138. The pump 138 of the upper chamber 18 and those of the process chamber 16 are connected to a pressure controller 142, which controls the amount of gases exhausted by the exhaust pump 138 according to the pressure in the process chamber 16 to keep the pressure difference between the chambers 16 and 18 in a predetermined range.

Pressure in the process chamber 16, temperature of the substrate S set by the temperature adjuster member 32, kinds, flow rates and temperatures of gases supplied through the heads 62 and 82, voltages applied to the coils 106a and 106b, and others are displayed on an operation panel and confirmed and adjusted by the operator.

Citing a case where polysilicon or amorphous silicon film is formed on an LCD glass substrate, it will be described how the plasma CVD apparatus is operated.

The LCD glass substrate S is mounted on the work table 22 and fixed on it by the clamp 28. Heat transmitting gas is supplied between the work table 22 and the substrate S and the temperature of the substrate S is set to 350°–450° C. by the temperature adjuster member 32. The process chamber 16 is exhausted to a predetermined pressure of $1 \times 10^{-7}$–$10^{-3}$ Torr, for example. Gas to be decomposed such as gas containing silane ($SiH_4$) and hydrogen ($H_2$) is supplied into the process chamber 16 through the first head 62 while inactive gas such as helium (He) into it through the second head 82. The pressure in it becomes $1 \times 10^{-3}$–$10^{-4}$ because of silane, hydrogen and helium gases supplied.

When high frequency of 13.56 MHz, for example, is applied to the coils 106a and 106b under this state, inducted electromagnetic fields are formed in the process chamber 16 and helium gas is thus transformed into plasma. Ions or electrons in the plasma pass through spaces 78 of the first head 62, excite silane and hydrogen gas and assist its decomposition. Silicon obtained when silane is decomposed is deposited on the substrate S to form polysilicon or amorphous silicon film on it.

A part of a by-product film deposited on the partition plate 14 is decomposed and vaporized by the helium gas plasma and thus removed from the partition plate 14 during the film forming process. Gas components thus generated, other gas components not used for film forming, and by-products are exhausted by the exhaustion, which is kept running during the film forming process, from the process chamber 16 through the exhaust opening 52.

Bias potential of high frequency is applied from the power supply 46 to the lower electrode 26 during the film forming process. Ions or electrons in the helium gas plasma are thus drawn downwards to more easily pass through spaces 78 of the first head 62. Further, bias potential applied to the lower electrode 26 is high frequency, so that it can be prevented that only ions in plasma are drawn into the electrode to raise the potential of it.

The coils 106a and 106b generate Joule heat because of high frequency voltage applied. When high frequency voltage of 13.56 MHz and 200 W is applied to a coil made of Cu and having an outer diameter of 6 inches, for example, a temperature rise of 180°–250° C. is caused in the coil. When this temperature is transmitted directly to the partition plate 14 made of quartz, micro-cracks are caused in the plate 14. The seats 104 for supporting the coils 106a and 106b on them are made of ceramics which is adiabatic and less disturbs electromagnetic field. They can, therefore, protect the partition plate 14 from heat without adding any undesirable effect to the formation of plasma.

Coolant such as nitrogen gas is supplied on the coils 106a and 106b through the head 122 during the film forming process. However, pressure difference between in the process and upper chambers 16 and 18 is kept lower than a predetermined value by the controller 142. In short, the controller 142 controls the amount of gases exhausted by the exhaust pump 138 according to the amount of nitrogen gas supplied from the head 122. This prevents large load caused by the pressure difference from being added to the partition plate 14.

Figure 11:
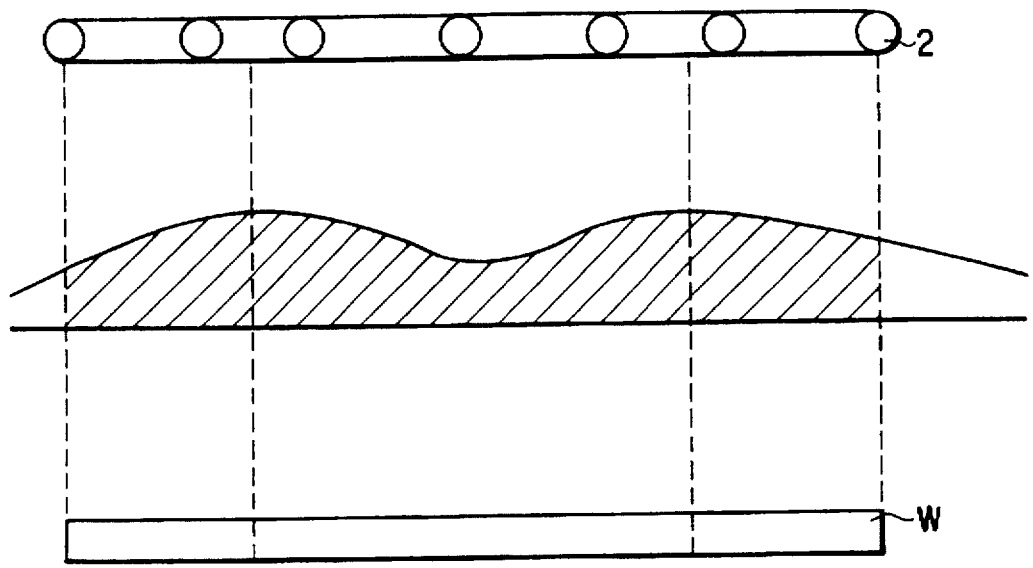
FIG. 11 shows the profile of film thickness of a film formed by a conventional apparatus.

FIG. 10 shows the profile of film thickness of a film thus formed. A hatched portion between the substrate S and the coils 106a, 106b in FIG. 10 represents the profile of film thickness of the film formed. When the apparatus of the present invention as used, the formed film has a little unevenness and its uniformity of film thickness can be improved, as compared with the one formed by the conventional apparatus, as apparent from FIG. 11.

Conditions under which the process of forming thin film transistors on the LCD glass substrate is carried out will be described.

Table 1 shows the relation between gases to be used and kinds of films formed by CVD. When amorphous silicon film is to be formed, silane ($SiH_4$) and hydrogen ($H_2$) are supplied through the first head 62 while helium (He) through the second head 82. Gas such as argon can be used instead of helium in this case. When amorphous silicon nitride film is to be formed, silane ($SiH_4$) is supplied through the first head 62 while nitrogen ($N_2$) through the second head 82. When silicon oxide film is to be formed, silane ($SiH_4$) is supplied through the first head 62 while oxygen ($O_2$) through the second head 82.

TABLE 1

| Kinds of Film | Gases used |
| --- | --- |
| Amorphous Silicon Film (a - Si) | $SiH_4 + HeH_2$ |
| Amorphous Silicon Nitride Film (a - SiN) | $SiH_4 + N_2$ |
| Silicon Oxide Film ($SiO_x$) | $SiH_4 + O_2$ |

Table 2 shows the relation between films to be etched and gases to be used in the thin film transistor forming process.

TABLE 2

| Film etched | Gases used |
| --- | --- |
| Aluminum (Al) | $Cl_2 + BCl_3$ |
| Amorphous Silicon (a - Si) | $CF_4$, $SF_6$, or Mixture of $Cl_2/SF_6$ |
| Silicon Nitride (SiN) | $SF_6$ |

Figure 7:
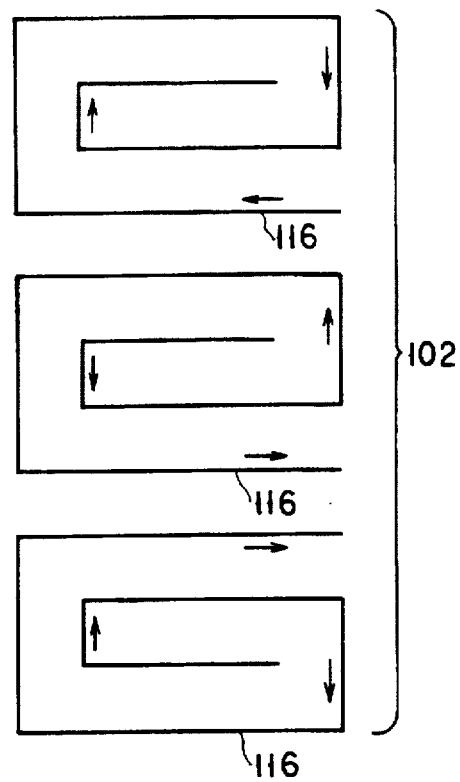
FIGS. 7 through 9 are plan views showing variations of the induction electrode.
Figure 8:
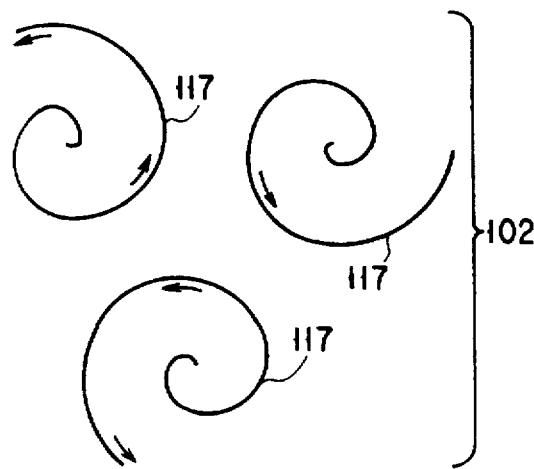
Figure 9:
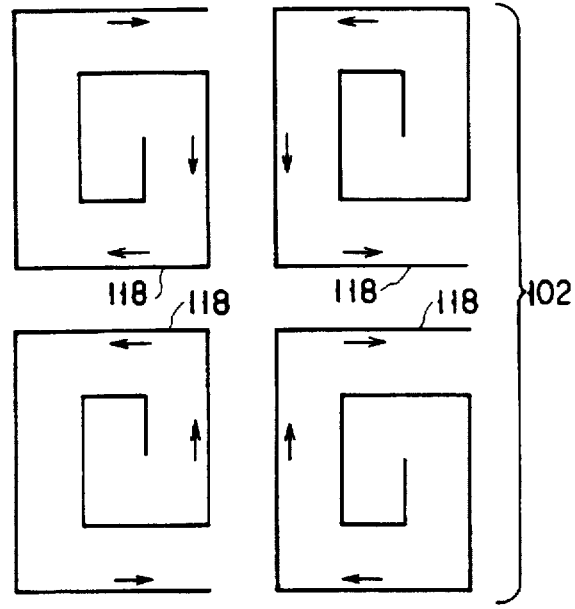

FIGS. 7 through 9 show variations of the induction electrode 102.

In the variation shown in FIG. 7, the electrode 102 comprises three coils 116 arranged side by side. In this case, directions of current flowing through adjacent portions of these coils 116 coincide with each other to enable electromagnetic fields formed by adjacent coils not to interfere with each other.

In the variation shown in FIG. 8, three coils 117 are arranged at vertexes of an equilateral triangle. When arranged in this manner, it cannot be avoided that directions of current flowing through adjacent portions of two coils become reverse to each other, whatever direction current flowing through each coil may be set to have. In this variation, therefore, the phase of high frequency applied to each of three coils 117 is shifted from the other by 120 degrees (=360/3) to thereby enable electromagnetic fields formed by adjacent coils to less interfere with each other. As shown in FIG. 1, a phase shift circuit 114 is arranged between the matching circuit 108 of each coil and a power supply 112 in this case to shift the phase of each coil from the other.

In the variation shown in FIG. 9, four coils 118 are arranged at vertexes of a rectangle. When directions of current flowing through adjacent portions of coils arranged side by side coincide with each other in this case, those of current flowing through adjacent portions of coils arranged on a diagonal line of the rectangle become reverse to each other. In this variation, therefore, the phase of high frequency applied to each of four coils 118 is shifted from the other by 90 degrees (=360/4) to thereby enable electromagnetic fields formed by coils on the diagonal line to less interfere with each other. As shown in FIG. 1, the phase shift circuit 114 is also arranged between the matching circuit 108 of each coil and the power supply 112 in this case to shift the phase in each coil from the other.

Although voltage is applied from a single high frequency power supply to coils in the electrode 102 shown in FIGS. 6 through 9, every coil may has a power supply. The spiral shape and the turn number of each coil may be changed according to the film forming process selected.

Figure 14:
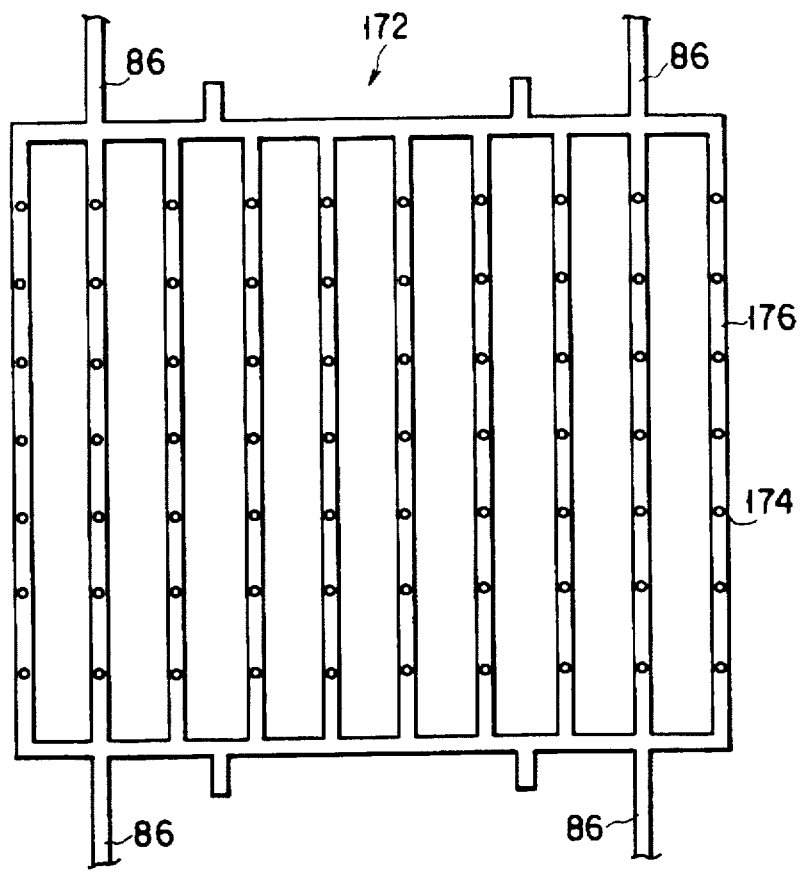

FIGS. 12 through 14 show variations of first and second gas supply heads 62 and 82.

FIG. 12 is a bottom view showing a variation of the first lower head through which gas to be decomposed is supplied. This head 152 is made of the same material as that of the first head 62 shown in FIG. 2. It is a pipe lattice 156 comprising an outer pipe frame and pipes extending in the outer pipe frame in the vertical direction. The pipe lattice 156 has an area 10–50% larger than the process region of the substrate S to thereby fully cover the whole of it. Vertical pipes are arranged in the outer pipe frame of the pipe lattice 156 at the same interval. Supply holes 154, orienting just downwards, are formed in the underside of the pipe lattice 156 at the same interval as that between the vertical pipes in the outer pipe frame of the pipe lattice 156. They are therefore arranged in a plane parallel to the support face of the work table 22 and the substrate S on it to fully and uniformly cover the whole of the process region of the substrate S. Each pipe of the pipe lattice 156 has an outer diameter of ¼ inches with a wall thickness of 1 mm under the standard and each supply hole 154 has a diameter of 0.1 mm–0.5 mm.

FIG. 13 is a bottom view showing a variation of the second upper head through which gas to be transformed into plasma is supplied. This head 162 is also made of the same material as that of the above-mentioned second head 82. It is substantially the same in dimension and structure as the first head 62 shown in FIG. 2. The connection tube 86 is connected to a pipe lattice 166 at plural or four points thereof, two of which are paired each other and opposed to the other remaining two. Supply holes 164, orienting not sidewards as seen in the head 82 but just downwards, are formed in the underside of the pipe lattice 166 at crossed pints thereof.

FIG. 14 is a bottom view showing another variation of the second upper head through which gas to be transformed into plasma is supplied. This head 172 is made of the same material as that of the above-mentioned second head 82. It is substantially the same in dimension and structure as the first head 152 shown in FIG. 12. The connection tube 86 is connected to a pipe lattice 176 at plural or four points thereof, two of which are paired each other and opposed to the remaining two. Supply holes 174 are oriented not sidewards as seen in the head 82 but just downwards.

The shape of supply heads shown in FIGS. 2, 3 and 12 through 14 can be changed according to that of objects to be processed. They can be shaped like a circle when objects to be processed have a shape of circle like semiconductor wafers.

A test relating to the distribution of flow rates of gas supplied through the supply holes 64 was carried out, using the head 62 or pipe lattice 76 of the shower type shown in FIG. 2. Results thus obtained will be described.

Briefing of Calculations

The head 62 to be calculated comprised combining quartz-made pipes, each having an outer diameter of ¼ inches (and an inner diameter of 4.2 mm), as pipe lattice 76. Supply holes 64 each having a diameter D were arranged I=7 units in a direction X and J=6 units in a direction Y and their total became 42 units (=I×J). Gases were supplied to the pipe lattice 76 through the tube 66 which were connected to it at four points thereof.

It was assumed in the calculations that the head 62 was arranged in the process chamber 16 which had been set to have pressure Pr and temperature Tr.

A thermal-liquid analysis soft ware "FLUENT" was used in the analysis, but it was difficult to define the combination of cylindrical pipes and it was therefore assumed that each pipe was a square column whose sectional area of flow path had a side of 4 mm. The sectional area of flow path is 1.15 times larger than in the practical case. The increase of this sectional area of flow path must be considered in the result of analysis.

The flow rate of gas flowing into the process chamber could not be defined as a boundary condition. Therefore, difference ΔP=Ps–Pr was used as the boundary condition wherein Pr denoted pressure in the process chamber and Ps pressure at the point at which the tube 66 was connected to the head 62.

The supply hole 64 is quite small, as compared with the whole of the head 62, and the number of lattices to be calculated becomes large accordingly. To reduce the burden of calculations, therefore, the following modeling was carried out.

i) The head 62 is symmetrical in all directions. Analysis was therefore conducted about ¼ of the whole of the head 62.

ii) A porous media model was used at each supply hole 64 of the head 62 to provide pressure effect in accordance with its hole diameter.

Conditions used in the calculations are shown in Table 1.

TABLE 3

| Case | D(mm) | Ps(Torr) | Pr(Torr) | Tr(°C.) | Gas Composition |
|------|-------|----------|----------|---------|-----------------|
| 1 | 0.5 | 1.2 | 0.2 | 250 | 20% $SiH_4$ + 80% $N_2$ |
| 2 | 0.3 | 1.2 | 0.2 | 250 | 20% $SiH_4$ + 80% $N_2$ |
| 3 | 0.3 | 2.2 | 0.2 | 250 | 20% $SiH_4$ + 80% $N_2$ |

Results and Study

Figure 15:
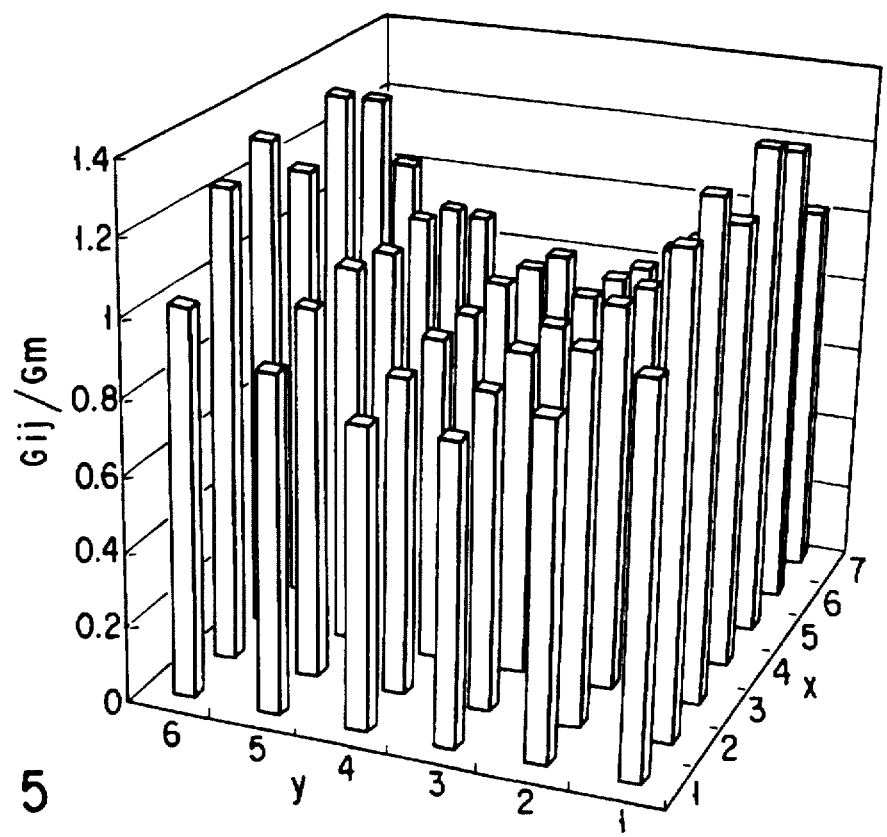

Flow rate distributions Gij/Gm obtained under the condition in each case are shown in FIGS. 15 through 17 and Total flow rates obtained and the uniformity of flow rate distributions are shown in Table 4. Gij represents a flow rate at each supply hole 64 and Gm=G/I×J denotes an average flow rate.

TABLE 4

| Case | G(sccm) | Unif. (+%) |
|------|---------|------------|
| 1 | 137 | 25 |
| 2 | 66.5 | 8.8 |
| 3 | 130 | 5.8 |

When case 1 is compared with case 2, it is found that the uniformity of flow rate distribution becomes better as the diameter D of each supply hole 64 becomes smaller. When case 2 is compared with case 3, the uniformity becomes by far better as G is increased, but it is found that D contributes more to a better uniformity of flow rate distribution than G does. In short, D may be made as small as possible to obtain a uniform flow rate distribution. When D is made small, however, film is deposited on the substrate to copy positions of supply holes on the substrate. A measure of increasing the distance between the head 62 and the substrate S, for example, will be needed in this case.

Figure 18:
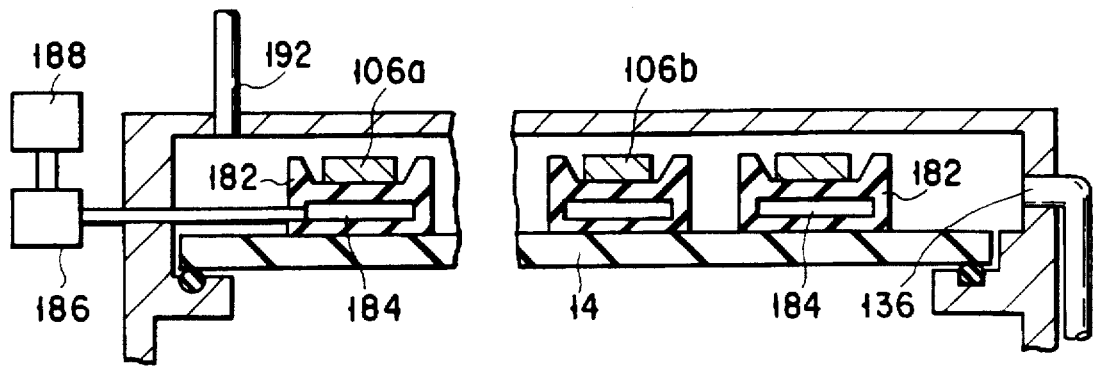
FIG. 18 is a sectional view showing a variation of the upper chamber.

FIGS. 18 and 19 show a variation of the system for cooling the coils 106a and 106b. No head 122 of the shower type for supplying coolant such as nitrogen gas is provided in this variation but a coolant flow passage 184 is formed instead in a ceramics-made seat 182. A pair of the seats 182 are provided to correspond to the coils 106a and 106b and they are spiraled extending along their corresponding coils 106a and 106b. The coolant flow passage 184 is connected to a coolant source 188 via a temperature adjuster member 186 and coolant supplied from the coolant source 188 is circulated in the coolant flow passage 184. Gas such as $N_2$ or liquid coolant commercially available can be used as coolant. A line 192 is connected to an end of the upper chamber 18 and temperature-adjusted gas is introduced into the chamber 18 through the line 192 to adjust pressure in the chamber 18.

Figure 20:
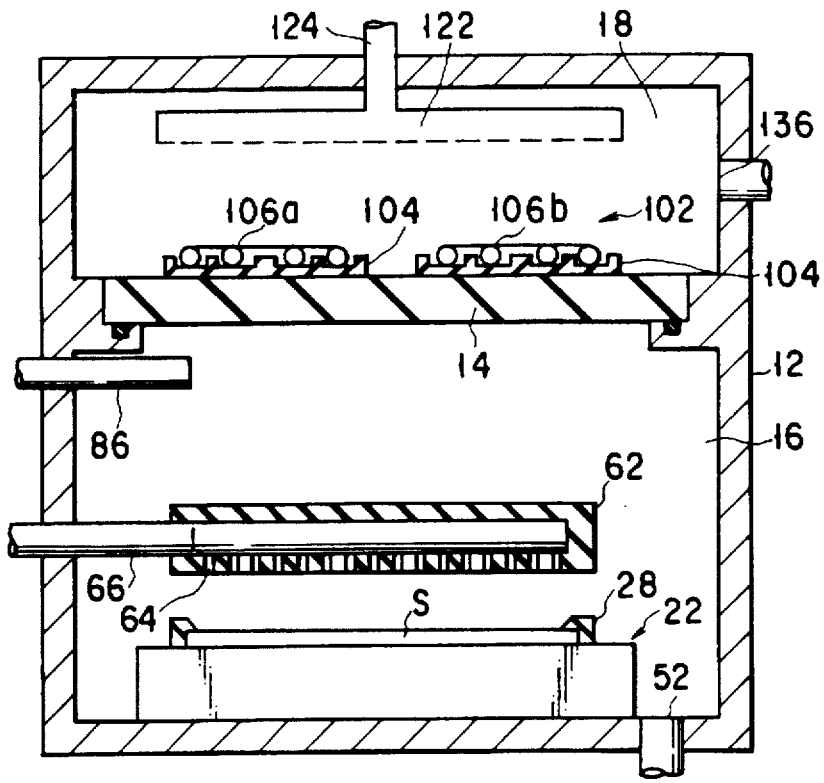
FIGS. 20 and 21 are sectional views showing plasma CVD apparatuses according to second and third embodiments of the present invention, respectively.
Figure 21:
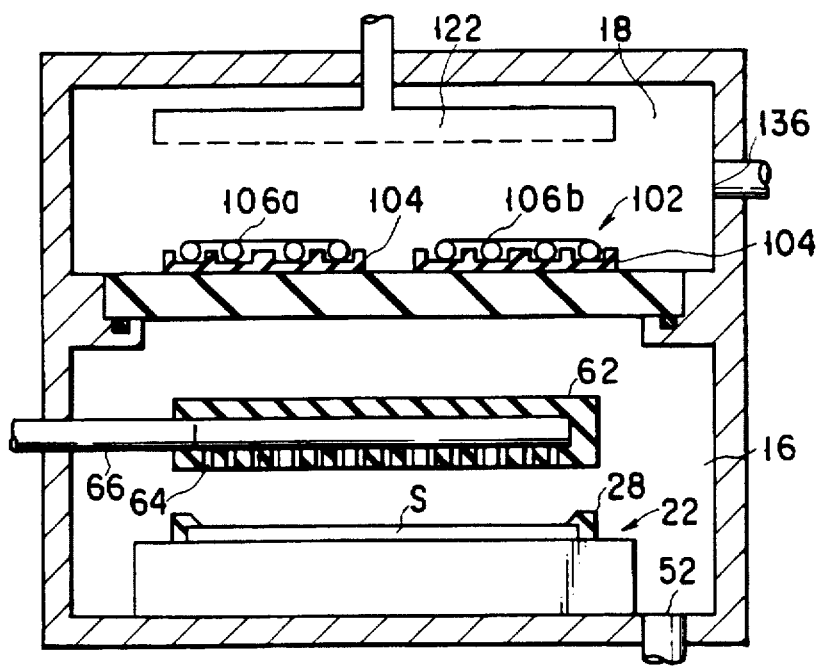

FIGS. 20 and 21 are sectional views showing main portions of the plasma CVD apparatus according to second and third embodiments of the present invention. These embodiments are the same as the first apparatus shown in FIG. 1 except the following points. The same components as those of the first embodiment will be therefore described only when needed.

In the second apparatus shown in FIG. 20, the second head 82, through which gas to be transformed into plasma is supplied, is not provided, but this gas is supplied directly between the partition plate 14 and the first head 62 through the tube 86.

In the third apparatus shown in FIG. 21, the tube 86 is not provided, but all of process gases are supplied into the process chamber 16 through the first head 62. The distance between the coils 106a, 106b and the first head is made by far smaller than that in the first and second embodiments. Gases supplied through the head 62 are transformed directly into plasma by electromagnetic fields generated by the coils 106a and 106b. In the third embodiment, a head provided with no spaces 78 can be used instead of the lattice head 62 having spaces 78. This is because spaces 78 of the lattice head 62 in the first and second embodiments are intended mainly to enable ions and electrons drawn from plasma, which is formed above the head 62, to pass through them.

A process system of the cluster tool type provided with a plasma process apparatus according to the present invention will be described with reference to FIG. 22.

The system has an air-tight common transfer chamber 210. Pressure in the common transfer chamber 210 is kept to be in a range of $n \times 10^{-3}$ Torr–$n \times 10^{-2}$ Torr. A first transfer arm 212 for transferring a substrate by an electrostatic chuck (not shown) is arranged in the common transfer chamber 210.

Air-tight containers 221, 223 and 225 of process apparatus 220, 222 and 224 are connected to three sides of the common transfer chamber 210. Gate valves 214, 216 and 218 are arranged between the transfer chamber 210 and the containers 221, 223, 225 to selectively communicate the transfer chamber 210 with one of them. One of the gate valves 214, 216 and 218 is opened at a time to prevent the process apparatus 220, 222 and 224 from being influenced by another through the transfer chamber 210.

At least one of the process apparatus 220, 222 and 224, but all of them in this system are plasma process apparatuses according to the present invention. Induction electrodes 226, 228 and 230 each comprising a pair of flat spiral coils are arranged in centers of the process apparatus 220, 222 and 224.

An auxiliary vacuum chamber 234 is connected to a fourth side of the common transfer chamber 210 through a gate valve 232. It is used to pre-heat the substrate to a predetermined temperature before the substrate is processed. It is also used to cool the substrate, which has been heated while being processed, to a predetermined temperature before the substrate is transferred into the cassette or mounted on a certain place. The transfer arm 212 in the common transfer chamber 210 is used to transfer the substrate between the auxiliary vacuum chamber 234 and one of the process apparatus 220, 222 and 224.

Pressure in the auxiliary vacuum chamber 234 is kept to be in a range of $n \times 10^{-3}$ Torr–$n \times 10^{-2}$ Torr. A resistance heater embedded in a table or a lamp for directly heating the substrate can be used as the pre-heating member. A tube through which commercially available coolant or liquid nitrogen is circulated in a table can be used as the cooling member. Heat transmitting gas such as He is supplied between the substrate and the table to increase heat transmission in vacuum. When the pre-heating and cooling members are arranged like steps, plural substrates can be individually heated and cooled at the same time.

A second transfer chamber 238 is connected to that side of the auxiliary vacuum chamber, which is opposed to the common transfer chamber 210, through a gate valve 236. A second transfer arm 240 is arranged in the second transfer chamber 238. A cassette chamber 244 is connected to that side of the second transfer chamber 238, which is opposed to the auxiliary vacuum chamber 234, through a gate valve 242. At least one cassette 246 in which plural or 25 sheets of substrates can be horizontally housed is mounted on a stage (not shown) in the cassette chamber 244. A gate valve 248 is arranged to that side of the cassette chamber 244, which is opposed to the second transfer chamber 238, to communicate the cassette chamber 244 with outside the process system.

It will be described how the above-described process system is operated.

The cassette 246 in which substrates are housed is transferred from another semiconductor process system to the above-described one by an auto-transfer unit such as the robot (ACV). It is transferred into the cassette chamber 244 through the gate valve 248 and placed at a certain position in the chamber 244.

The gate valve 248 is closed and gas in the cassette chamber 244 is replaced by inactive gas such as $N_2$. The gate valve 242 is then opened and substrates in the cassette 246 are transferred one by one into the pre-heating section in the auxiliary vacuum chamber 234 by the second transfer arm 240 in the second transfer chamber 238.

The gate valve 236 is closed and the auxiliary vacuum chamber 234 is exhausted to a predetermined pressure. After the pre-heating of substrates is finished, the gate valve 232 is opened and the transfer arm 212 receives the substrate in the auxiliary vacuum chamber 234 and transfers it into the common transfer chamber 210. The gate valve 232 is then closed.

The substrate is transferred from the common transfer chamber 210 into selected one of the apparatus 220, 222 and 224 by the transfer arm 212 and processed in it. The substrate to which all of the processes have been applied is returned reversely on the same course and finally to the cassette 246 in the cassette chamber 244 and housed in it.

The apparatus 220, 222 and 224 can be used to apply the same process to plural substrates. They can also be used to successively apply different processes to one substrate.

The process of manufacturing transistors of the thin film type can be cited as an example of successively applying different processes to one substrate. According to this transistor making process, three layers of a-Si (amorphous silicon), SiNx (silicon nitride) and $n^+$ type a-Si films are successively formed on a glass substrate. When the plasma CVD system intended to carry out the transistor making process employs the CVD apparatus of the present invention described with reference to FIGS. 1 through 21, a more uniform film forming process can be applied to a substrate having a larger area.

As the process apparatus 220, 222 and 224, parallel plate type plasma process, heat CVD, ECR type plasma process, sputtering, ashing and etching apparatuses can be used to meet any process intended.

The plasma process apparatus according to first through third embodiments of the present invention have been described as CVD apparatus, but the present invention can be also applied to the plasma etching, ashing and sputtering apparatuses. According to the present invention, plasma generated relative to the substrate can be made more uniform and the uniformity of process applied to a face of the substrate can be improved to a greater extent.

In particular, a plasma etching apparatus according to the present invention, which includes an induction electrode comprising a plurality of coils and a shower head for supplying an etching gas, is suitable for etching a transparent electrode made of indium tin oxide (ITO), which is used as a common electrode of a LCD.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for processing a process region of a substrate; using a plasma, comprising:

a container substantially formed of a conductive material;

a partition plate dividing said container into an air-tight process chamber and an air-tight auxiliary chamber, and having a window plate made of dielectric;

a main pump exhaust for exhausting and setting said process chamber to a vacuum;

a work table arranged in said process chamber and having a support face facing said window plate, said substrate being mounted on said support face, with said process region facing said window plate;

a main supply for supplying a process gas between said window plate and said substrate mounted on said support face, at least part of said process gas being transformed into said plasma;

an induction electrode, for generating electromagnetic field between (1) said window plate and (2) said substrate mounted on said support face, to induce generation of said plasma, and including a coil arranged in said auxiliary chamber and facing said window plate;

a power supply section for applying a high frequency voltage to said coil;

an auxiliary exhaust pump for exhausting and setting said auxiliary chamber to a vacuum; and a pressure controller connected to said auxiliary exhaust pump for keeping a pressure difference between pressures in said process and auxiliary chambers at a minimum value.

2. The apparatus according to claim 1, further comprising grounding means for grounding said container.

3. The apparatus according to claim 1, wherein said pressure controller is connected to said main exhaust pump.

4. The apparatus according to claim 1, further comprising a cooler for cooling said coil.

5. The apparatus according to claim 1, further comprising an auxiliary supply for supplying an inactive gas into said auxiliary chamber.

6. The apparatus according to claim 5, wherein said inactive gas supplied into said auxiliary chamber is a coolant, by which said coil is cooled.

7. The apparatus according to claim 6, wherein said auxiliary supply comprises a shower head arranged above said coil and having a plurality of gas supply holes facing said coil.

8. The apparatus according to claim 1, further comprising a seat arranged on said window plate and supporting said coil.

9. The apparatus according to claim 8, wherein a passage through which coolant is circulated is formed in said seat.

10. The apparatus according to claim 1, further comprising a lower electrode arranged in said work table and a power supply for applying a high frequency potential to said lower electrode.

11. The apparatus according to claim 10, wherein said apparatus is a plasma CVD apparatus to form a film on said process region of said substrate, said process gas is decomposed to provide a material of said film.

12. The apparatus according to claim 11, wherein said process gas comprises first and second gases, and said main supply comprises first and second supply members respectively supplying said first and second gases, and wherein said second gas is transformed into said plasma while said first gas is excited and decomposed by said plasma.

13. The apparatus according to claim 12, wherein said first supply member includes a supply port arranged between said window plate and said support face, and said second supply member includes a supply port arranged between said window plate and said supply port of said first supply member.

14. The apparatus according to claim 13, wherein said first supply member comprises a first supply head arranged between said window plate and said support face and made of dielectric, and said supply port of said first supply member comprises a plurality of supply holes formed on said first supply member and arranged to uniformly cover the whole of said process region of said substrate mounted on said support face.

15. The apparatus according to claim 14, wherein said first supply head comprises a lattice formed of a combination of pipe elements through which said first gas flows.

16. The apparatus according to claim 15, wherein said second supply member comprises a second supply head arranged between said window plate and said first supply head, made of dielectric, and comprising continuous frame formed of a combination of pipe elements through which said second gas flows, and said supply port of said second supply member comprises a plurality of supply holes formed on said second supply member.

* * * * *